United States Patent
Lin et al.

(10) Patent No.: US 9,854,671 B1
(45) Date of Patent: Dec. 26, 2017

(54) CIRCUIT BOARD AND METHOD OF MANUFACTURING THE SAME

(71) Applicant: Unimicron technology Corp., Taoyuan (TW)

(72) Inventors: Wei-Ti Lin, Taoyuan (TW);
Chun-Hsien Chien, Taoyuan (TW);
Yu-Chung Hsieh, Taoyuan (TW);
Yu-Hua Chen, Hsinchu (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 15/410,745

(22) Filed: Jan. 19, 2017

(30) Foreign Application Priority Data

Nov. 28, 2016 (TW) .............................. 105139120 A

(51) Int. Cl.
| | |
|---|---|
| *H05K 3/42* | (2006.01) |
| *H05K 1/11* | (2006.01) |
| *H05K 1/16* | (2006.01) |
| *H05K 3/40* | (2006.01) |
| *H01F 27/28* | (2006.01) |
| *H01F 27/24* | (2006.01) |

(52) U.S. Cl.
CPC .............. *H05K 1/115* (2013.01); *H01F 27/24* (2013.01); *H01F 27/2804* (2013.01); *H05K 1/165* (2013.01); *H05K 3/4076* (2013.01); *H05K 3/42* (2013.01); *H05K 3/423* (2013.01); *H01F 2027/2809* (2013.01); *H05K 2201/086* (2013.01)

(58) Field of Classification Search
CPC ........ H05K 1/112; H05K 1/113; H05K 1/114;
H05K 1/115; H05K 1/116; H05K 3/42;
H05K 3/421; H05K 3/423; H05K 3/424;
H05K 3/425; H05K 3/426; H05K 3/427;
H05K 3/428; H05K 3/429
See application file for complete search history.

(56) References Cited

FOREIGN PATENT DOCUMENTS

| TW | 535496 B | 6/2003 |
|---|---|---|
| TW | I350715 B | 10/2011 |
| TW | I454194 B | 9/2014 |
| TW | 201603066 A | 1/2016 |

*Primary Examiner* — Jeremy C Norris
(74) *Attorney, Agent, or Firm* — CKC & Partners Co., Ltd.

(57) ABSTRACT

A circuit board includes a substrate, a first magnetic structure, a first dielectric layer and an inductive coil. The substrate has a top surface and a bottom surface. The first magnetic structure is disposed on the top surface of the substrate. The first dielectric layer covers the substrate and the first magnetic structure. The inductive coil includes a first interconnect, a second interconnect and a plurality of conductive pillars. The first interconnect is disposed on the first dielectric layer. The second interconnect is disposed on the bottom surface of the substrate. The conductive pillars connect the first interconnect and the second interconnect. The first interconnect, the second interconnect and the conductive pillars form a helical structure surrounding the first magnetic structure.

10 Claims, 10 Drawing Sheets

CIRCUIT BOARD AND METHOD OF MANUFACTURING THE SAME

RELATED APPLICATIONS

This application claims priority to Taiwan Application Serial Number 105139120, filed Nov. 28, 2016, which is herein incorporated by reference.

BACKGROUND

Technical Field

Recently, with the development of technology industry, electronic products such as notebooks, tablets, and smartphones have been broadly used in our daily life. Since the types and functions of electronic products are getting more various, circuit boards within the electronic products therefore become important in the related technology. Besides, in order to increase the applications of the circuit board, it can be designed as a multi-layer circuit board to increase the internal space for circuit layout depending on the design requirements, therefore, different electronic components, such as connectors, chips, or photoelectric components can be configured to the multi-layer circuit board according to the requirements for increasing functions.

Description of Related Art

The use of Inductive components is often required in chip packaging of the power supply control chip or of the wireless communication chip, conventionally, surface mount technology (SMT) is used after the circuit board is formed, to assemble the inductive components on the surface of the circuit board, however, with the technology developments, the sizes of electronic products are required to be more compact, therefore it is a challenge for miniaturizing the additional components, and the reliability is challenged due to the use of soldering.

SUMMARY

According to a plurality of exemplary embodiments of the present invention, a circuit board is provided. The circuit board includes: a substrate, a first magnetic structure, a first dielectric layer, and an inductive coil. The substrate has a top surface and a bottom surface. The first magnetic structure is disposed on the top surface of substrate. The first dielectric layer covers the substrate and the first magnetic structure. The inductive coil include: a first interconnect, a second interconnect and a plurality of conductive pillars. The first interconnect is disposed on the first dielectric layer. The second interconnect is disposed on the bottom surface of the substrate. A plurality of conductive pillars connect the first interconnect and the second interconnect, the first interconnect, the second interconnect and the conductive pillars form a helical structure surrounding the first magnetic structure.

In some exemplary embodiments, the substrate includes a polymer base plate, a second dielectric layer and a third dielectric layer, and the second dielectric layer and third dielectric layer are respectively disposed on two opposite surfaces of the polymer substrate, wherein the first magnetic structure contacts the second dielectric layer.

In some exemplary embodiments, the circuit board further includes a fourth dielectric layer and a second magnetic structure which are disposed between the polymer substrate and the third dielectric layer, wherein the second magnetic structure is disposed between the fourth dielectric layer and the third dielectric layer.

In some exemplary embodiments, the first magnetic structure includes at least a magnetic composite layer, the magnetic composite layer includes: a dielectric film; and a magnetic material disposed on the dielectric film.

In some exemplary embodiments, the conductive pillars penetrate the substrate and the first dielectric layer.

In some exemplary embodiments, the magnetic material is iron, cobalt, nickel, rubidium, or an alloy thereof.

In some exemplary embodiments, the circuit board further includes a first protective layer covering a first interconnect and the first dielectric layer, and a second protective layer covering the second interconnect and the bottom surface of the substrate.

According to a plurality of exemplary embodiments of the present invention, a method of manufacturing a circuit board is provided. The method includes: providing a substrate, the substrate has a top surface and a bottom surface; forming a magnetic structure on the top surface; forming a dielectric layer covering the magnetic structure; forming a plurality of holes, wherein the holes penetrates the substrate and the dielectric layer; forming a metal layer covering the dielectric layer and the bottom surface of the substrate, and filling the holes, wherein portions of the metal layer which fills the holes form a plurality of conductive pillars; and patterning the metal layer for respectively forming a first interconnect pattern on the dielectric layer and a second interconnect pattern on the bottom surface, wherein the first interconnect pattern, the second interconnect pattern and the conductive pillars form a helical structure surrounding the magnetic structure.

In some exemplary embodiments, the manner of forming the metal layer is electroplating, plasma-assisted atomic layer deposition, metalorganic chemical vapor deposition, chemical vapor deposition (CVD), physical vapor deposition (PVD), sputtering, or pulsed laser deposition.

In some exemplary embodiments, forming the magnetic structure includes alternately forming a plurality of dielectric films and a plurality of magnetic layers, wherein each of the dielectric films and each of the magnetic layers are alternately stacked.

The invention can be more fully understood by reading the following detailed description of the embodiments, with reference made to the accompanying drawings as follows.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
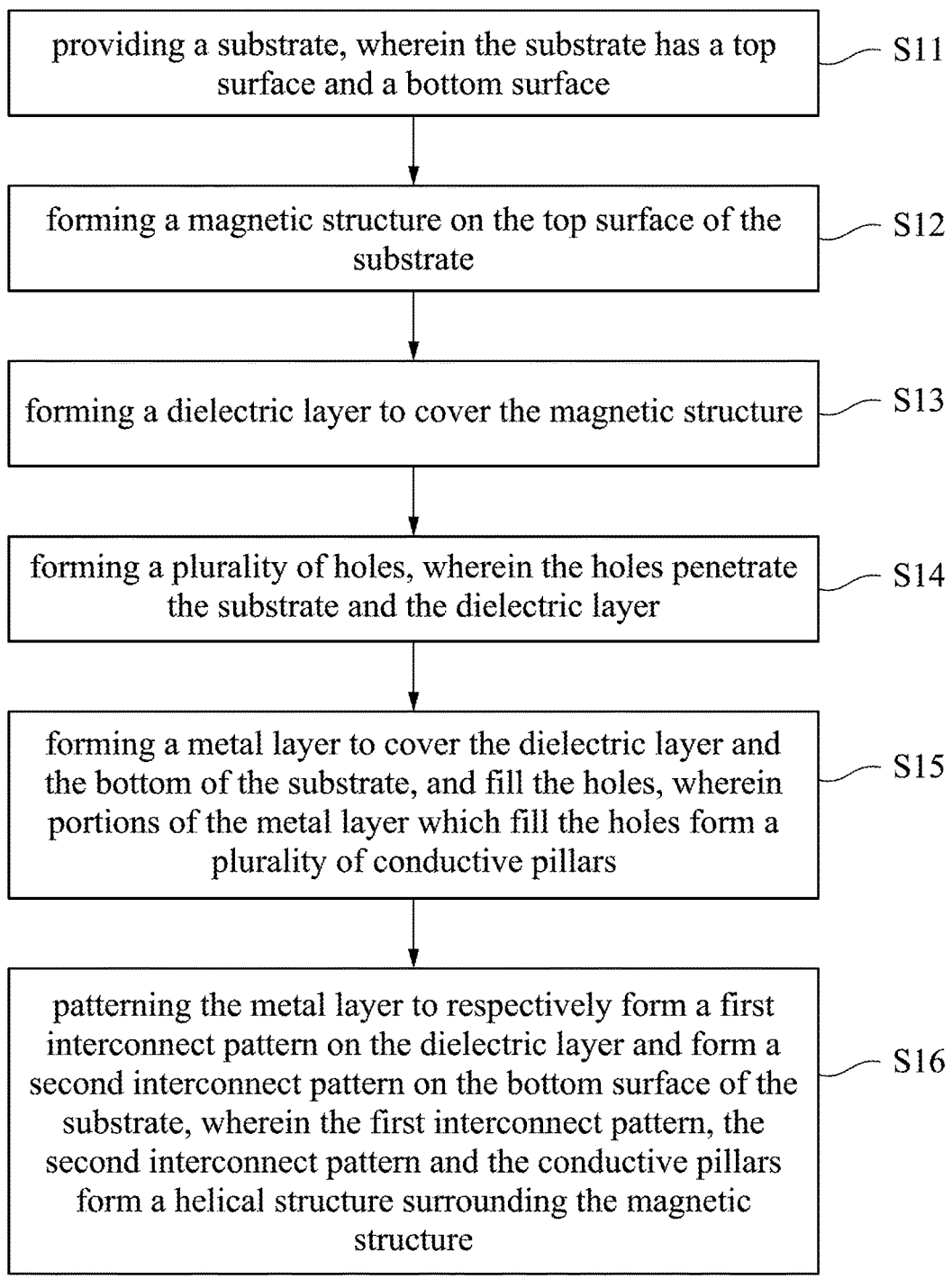
FIG. 1 is a flow chart of a method of manufacturing a circuit board according to some exemplary embodiments of the present invention.

The manufacture and use of the present embodiment will be discussed in detail below, however, it should be understood that the invention provides a practical innovation in which a wide variety of specific content may be presented. The embodiments or examples described below are illustrative only and are not intended to limit the scope of the invention.

As used herein, for the ease of describing the relationship of a certain element or features illustrated in the drawings to other elements or features, relative spatial terms such as "below", "under", "above", "upon" and similar expressions may be used. These relative spatial terms are intended to contain all the different orientations of the component used or operated, and are not limited to the orientation in the drawings. The device may be oriented (rotated 90 degrees or orientated in another direction) in other ways, while the space-relative descriptors used herein may be interpreted accordingly.

Various embodiments of a circuit board and a manufacturing method thereof are provided below, in which the structure and properties of the circuit board and the manufacturing steps or operations of the circuit board are described in detail.

In general, the inductive component is integrated into the package substrate by surface mount technology (SMT), and the inductive component is directly connected to the package substrate by reflow soldering, since the component is connected to the package substrate at the surface, the overall thickness or volume of the package cannot be effectively reduced.

To achieve the requirements for slim and compact package size, the present invention provides a circuit board structure and a method of manufacturing the same. The coil is directly formed in the circuit board, and its inductive effect is enhanced by the magnetic structure.

FIG. 1 is a flow chart of a method of manufacturing a circuit board according to some embodiments of the present invention. As shown in FIG. 1, the method 10 includes step S11, step S12, step S13, step S14, step S15, and step S16.

Figure 2:
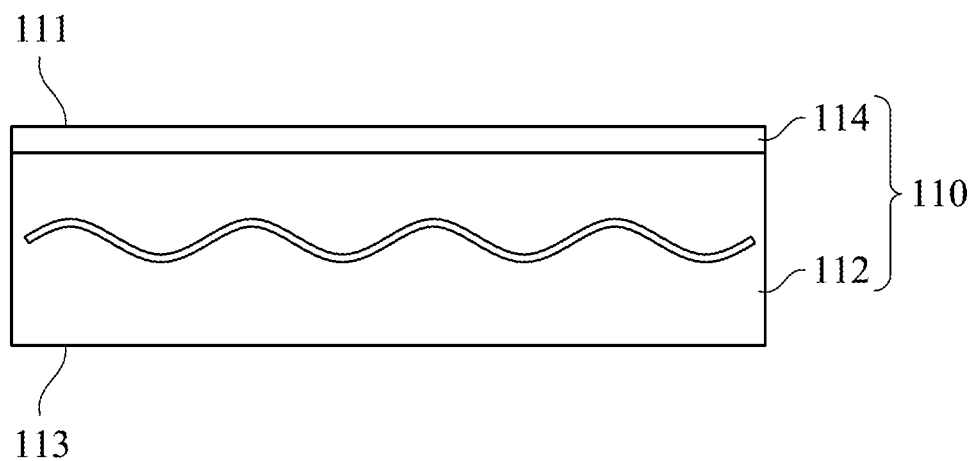
FIG. 2 is a cross-sectional view of a substrate according to some embodiments of the present invention.

Method 100 begins at step S11 by providing a substrate, wherein the substrate has a top surface and a bottom surface. In some embodiments, as shown in FIG. 2, the substrate 110 includes a base plate 112 and a dielectric layer 114, and the substrate 110 has a top surface 111 and a bottom surface 113. In some embodiments, the base plate 112 can be firstly provided, and then the dielectric layer 114 is formed on the base plate 112 for forming the substrate 110. The base plate 112 can be, for example, a polymer plate, a composite plate, or other conventional base plates. In one example, the base plate 112 is a polymer composite plate. In another example, the base plate 112 includes polymer materials (e.g., epoxy resin) and reinforcements (e.g., glass fibers, carbon fibers, Kevlar fibers, boron fibers, silicon carbide fibers, or combinations thereof). The dielectric layer 114 may be, for example, a silicone material, a suitable polymer material or a composite material of a polymer and a glass-ceramic.

Figure 3:
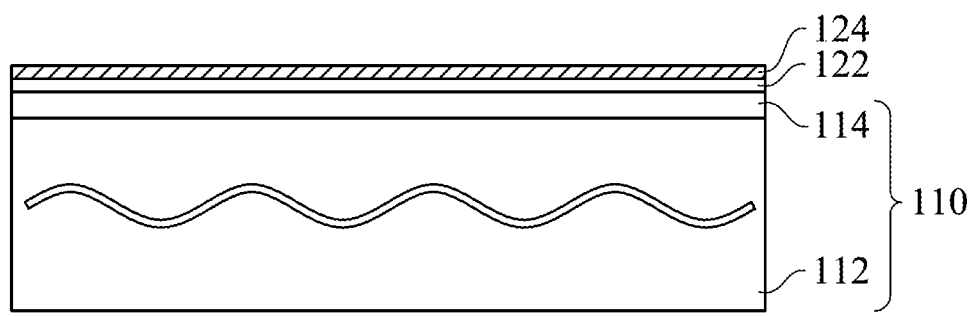
FIGS. 3 and 4A are cross-sectional views of detailed steps illustrating the formation of a magnetic structure on the top surface of the substrate according to some embodiments of the present invention.
Figure 4A:
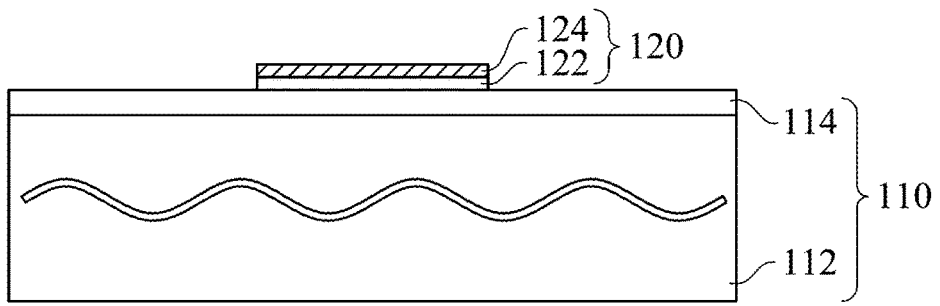

Method 10 proceeds to step S12 by forming a magnetic structure on the top surface of the substrate. FIGS. 3-4A are cross-sectional views of detailed steps illustrating the formation of a magnetic structure 120 on the top surface of the substrate 110 according to some embodiments of the present invention. As shown in FIG. 3, firstly, a dielectric material layer 122 is formed on the substrate 110, a magnetic material layer 124 is then formed on the dielectric material layer 122. The methods of forming the dielectric material layer 122 and the magnetic material layer 124 include (but are not limited to) plasma-enhanced atomic layer deposition, metalorganic chemical vapor deposition, chemical vapor deposition (CVD), physical vapor deposition (PVD), sputtering or pulsed laser deposition (PLD). In an exemplary embodiment, the dielectric material layer 122 can be a non-conductive thin film, such as silicon oxide, silicon nitride, metal oxide or metal nitride. In another embodiment, the magnetic material layer 124 is an alloy of monobasic, binary or multi-metal and has magnetic properties, such as iron, cobalt, nickel, rubidium, or an alloy thereof.

As shown in FIG. 4A, a patterning process is used for forming desired patterns on the dielectric material layer 122 and the magnetic material layer 124, thereby forming a first magnetic structure 120. The exemplary patterning process includes: forming a photoresist layer to cover the first magnetic structure 120, exposing the photoresist to form a pattern, perform a post exposure bake (PEB), and developing the photoresist to form a mask component including a photoresist. In another embodiment, a hard mask layer such as silicon nitride can be used as the mask component. Then, the areas which are not protected by the mask component may be etched by reactive ion etching (RIE), plasma dry etching, wet ditching and/or other suitable processes. The etching gas may be, for example, sulfur hexafluoride, silicon tetrachloride, octafluorocyclobutane, methane, hydrogen, argon or other known etching gases or a combination thereof.

Figure 4B:
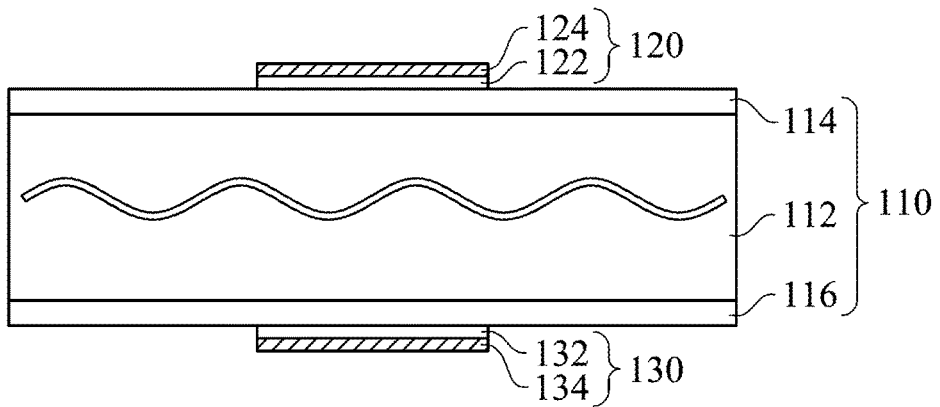
FIGS. 4B and 4C are cross-sectional views illustrating the formation of a first magnetic structure and/or a second magnetic structure according to some embodiments of the present invention.
Figure 4C:
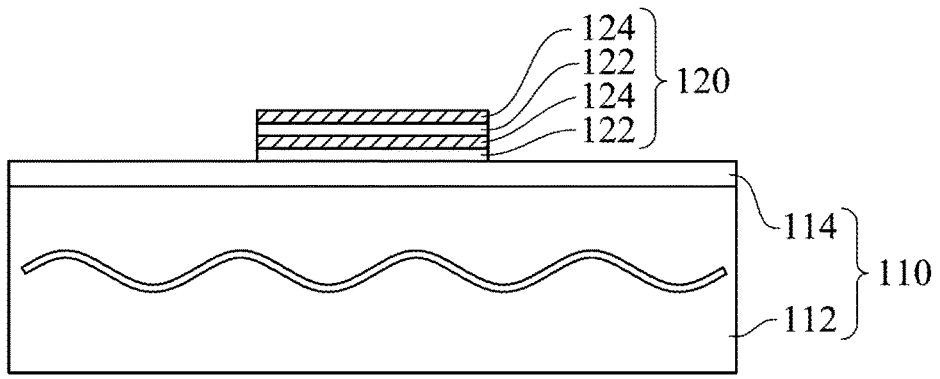

FIGS. 4B-4C are cross-sectional views illustrating the formation of a first magnetic structure 120 and/or a second magnetic structure 130 according to some embodiments of the present invention. In the embodiment illustrated in FIG. 4B, the substrate 110 includes a base plate 112, a dielectric layer 114 and a dielectric layer 116, wherein the dielectric layer 114 and the dielectric layer 116 are respectively disposed on the two opposite surfaces of the base plate 112. The first magnetic structure 120 and the second magnetic structure 130 are respectively formed on the two opposite surfaces of the substrate 110. The second magnetic structure 130 includes a dielectric film material layer 132 and a magnetic material layer 134. Since the forming method of the second magnetic structure 130 is the same as that of the first magnetic structure 120, further descriptions hence are omitted here for the sake of brevity.

In the embodiment illustrated in FIG. 4C, a first magnetic structure 120 is formed on the substrate 110. The first magnetic structure 120 has at least one magnetic composite layer, the magnetic composite layer includes a dielectric material layer 122 and a magnetic material layer 124, wherein the magnetic material layer 124 is disposed on the dielectric material layer 122. The step of forming the first magnetic structure 120 includes alternately forming a plurality of dielectric material layers 122 and a plurality of magnetic material layers 124, wherein each of the dielectric material layers 122 and each of the magnetic material layers 124 are alternately stacked. The number of the alternately stacked layers of the dielectric material layers 122 and the magnetic material layers 124 is not restricted, and when the number of the alternately stacked layers is greater, the electromagnetic induction of the later formed inductive component will be stronger, hence a plurality sets of the magnetic composite layers can be formed as the first magnetic structure 120 according to the design requirements. A person skilled in the art can easily understand that although FIG. 4C merely exemplary illustrates the first magnetic structure 120 with two magnetic composite layers, the first magnetic structure 120 in fact can include more magnetic composite layers. In another embodiment, it can also respectively form a first magnetic structure 120 and a second magnetic structure 130 on two opposite surfaces of the substrate 110, and at least one of the first magnetic structure 120 and the second magnetic structure 130 has a plurality of magnetic composite layers. In a further embodiment, the number of the magnetic composite layers in the first magnetic structure 120 and the number of that of the second magnetic structure 130 can be the same or be different.

Figure 5A:
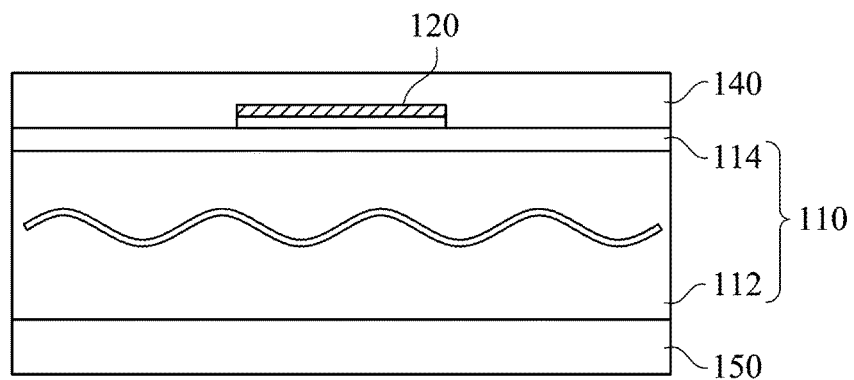
FIGS. 5A-5C are cross-sectional views illustrating the formation of the dielectric layers covering the magnetic structures according to some embodiments of the present invention.
Figure 5B:
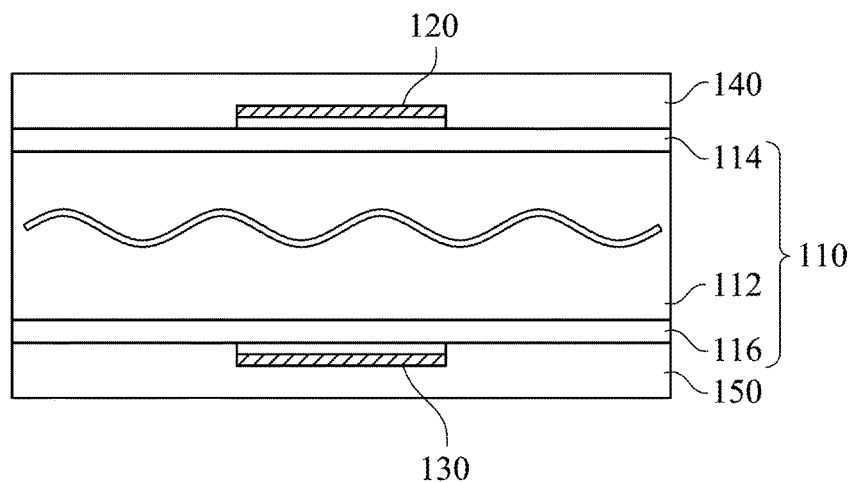
Figure 5C:
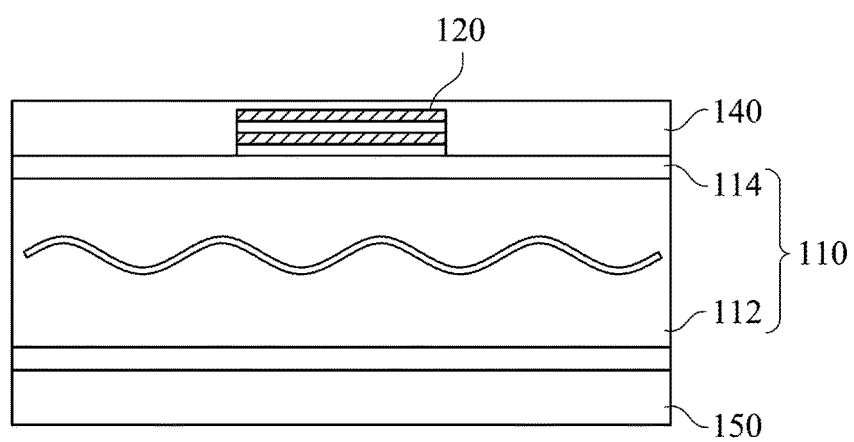

Next, method 10 proceeds to step S13 by forming a dielectric layer to cover the magnetic structure. FIG. 5A-5C are cross-sectional views illustrating the formation of a dielectric layer 140 and/or a dielectric layer 150 to respectively cover a magnetic structure 120 and/or a magnetic structure 130 according to some embodiments of the present invention, wherein FIG. 5A illustrates an embodiment which follows the embodiment in FIG. 4A, and FIG. 5B illustrates an embodiment which follows the embodiment in FIG. 4B, and FIG. 5C illustrates an embodiment which follows the embodiment in FIG. 4C. As shown in FIG. 5A, a dielectric layer 140 is formed to cover the first magnetic structure 120 and the top surface of the substrate 110, and a dielectric layer 150 is formed to cover the bottom surface of the substrate 110. In an embodiment, a lamination process or a bonding process can be used to form the dielectric layer 140 and the dielectric layer 150 at the same time. The dielectric layer 140 and the dielectric layer 150 can be, for example, polymer material and glass fibers, a suitable polymer material or a composite material of a polymer and a glass-ceramic. In another embodiment, the substrate 110 provided in preceding steps can further include a dielectric layer 150 which is disposed on the bottom surface of the base plate 112, hence, only the dielectric layer 140 is required to be formed for covering the first magnetic structure 120 and the top surface of the substrate 110. In one embodiment, the first magnetic structure 120 and the second magnetic structure 130 are respectively disposed on two opposite surfaces of the substrate 110, and the dielectric layer 150 covers the second magnetic structure 130 and the bottom surface of the substrate 110.

In the embodiment illustrated in FIG. 5B, the first magnetic structure 120 and the second magnetic structure 130 are respectively formed on two opposite surfaces of the substrate 110, wherein the substrate 110 includes a base plate 112, a dielectric layer 114 and a dielectric layer 116, and the dielectric layer 114 and the dielectric layer 116 are respectively formed on two opposite surfaces of the base plate 112. In this embodiment, the dielectric layer 140 and the dielectric layer 150 are formed to respectively cover the first magnetic structure 120 and the second magnetic structure 130. Since the composition and the method of forming the dielectric layer 140 and the dielectric layer 150 have been described above, further descriptions hence are omitted for the sake of brevity.

In the embodiment illustrated in FIG. 5C, the dielectric layer 140 and the dielectric layer 150 are formed to respectively cover the first magnetic structure 120 and the bottom surface of the substrate 110. The first magnetic structure 120 has a plurality of magnetic composite layers. Since the composition and the method of forming the dielectric layer 140 and the dielectric layer 150 have been described above, further descriptions hence are omitted for the sake of brevity.

Figure 6A:
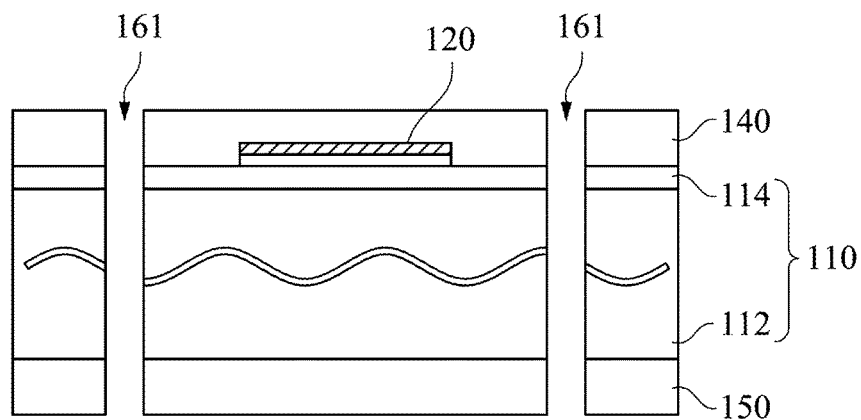
FIGS. 6A-6C are cross-sectional views illustrating the formation of the holes according to some embodiments of the present invention.
Figure 6B:
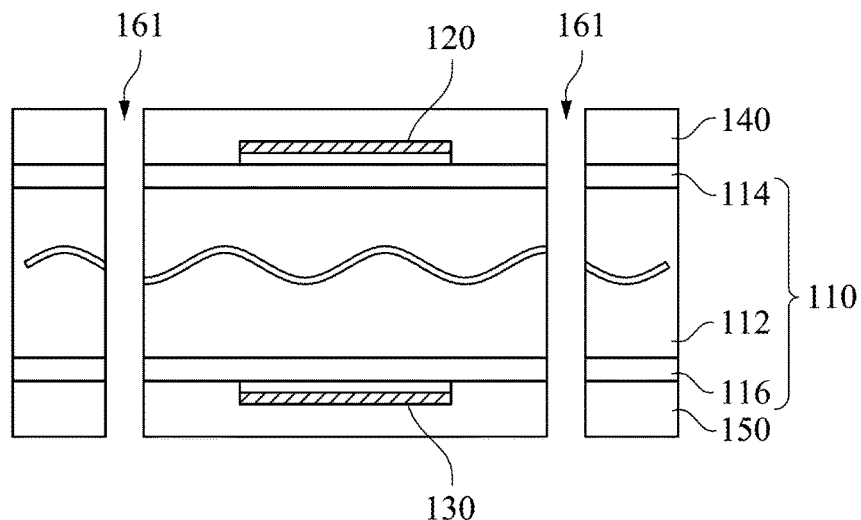
Figure 6C:
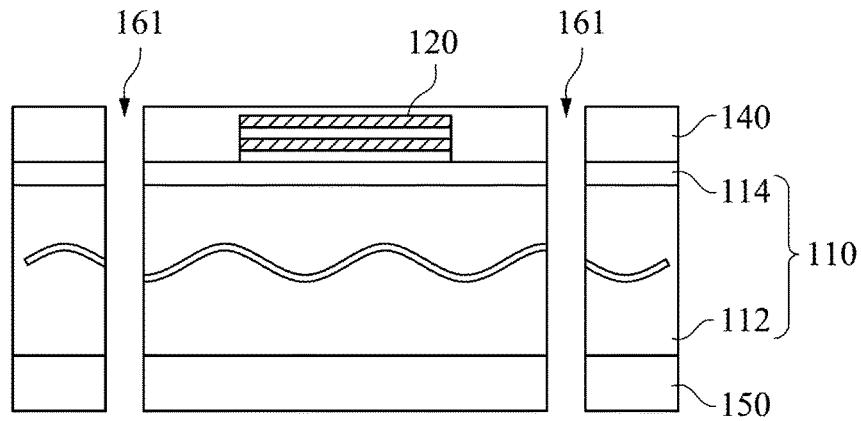

Next, method 10 proceeds to step S14 by forming a plurality of holes, wherein the holes penetrate the substrate and the dielectric layer. Please refer to FIGS. 6A-6C. FIGS. 6A-6C are cross-sectional views illustrating the formation of the holes 161 according to some embodiments of the present invention, wherein the FIG. 6A illustrates an embodiment which follows the embodiment in FIG. 5A, and FIG. 6B illustrates an embodiment which follows the embodiment in FIG. 5B, and FIG. 6C illustrates an embodiment which follows the embodiment in FIG. 5C. As shown in FIG. 6A, a plurality of holes 161 are formed and the holes 161 penetrate the base plate 112, the dielectric layer 114, the dielectric layer 140 and the dielectric layer 150. The method of forming the holes 161 includes laser drilling or mechanical drilling. In one embodiment, a desmear process may be optionally used after the holes 161 are formed. Because of the high temperature during the formation of the holes 161 may cause the polymer in the substrate 110 exceeding the glass transition temperature (Tg) to become a melting state and thereby generating smears. Hence, the desmear process can be performed to avoid the poor conductivity of the conductive pillars subsequently formed.

In the embodiment illustrated in FIG. 6B, a plurality of holes 161 are formed and the holes 161 penetrate the base plate 112, the dielectric layer 114, the dielectric layer 116, the dielectric layer 140, and the dielectric layer 150. Since the method of forming the holes 161 has been described above, further descriptions hence are omitted for the sake of brevity. In the embodiment illustrated in FIG. 6C, a plurality of holes 161 are formed and penetrate the base plate 112, the dielectric layer 114, the dielectric layer 140 and the dielectric layer 150.

Figure 7A:
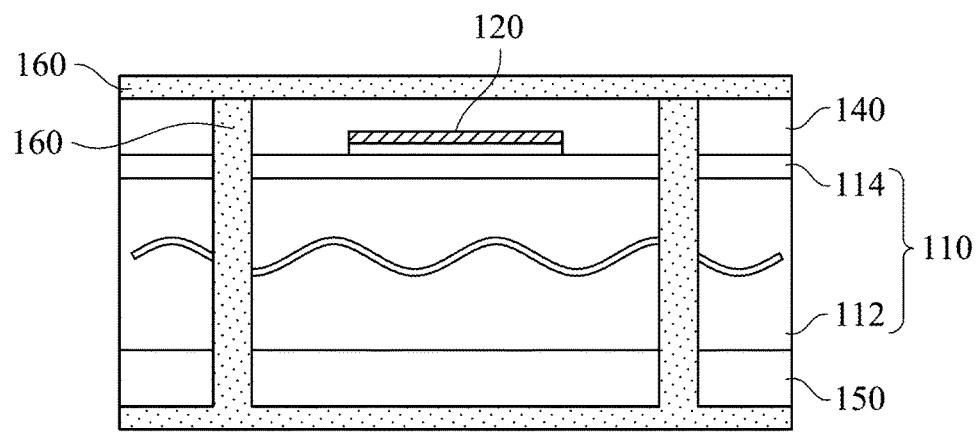
FIGS. 7A-7C are cross-sectional views illustrating the formation of the metal layer according to some embodiments of the present invention.
Figure 7B:
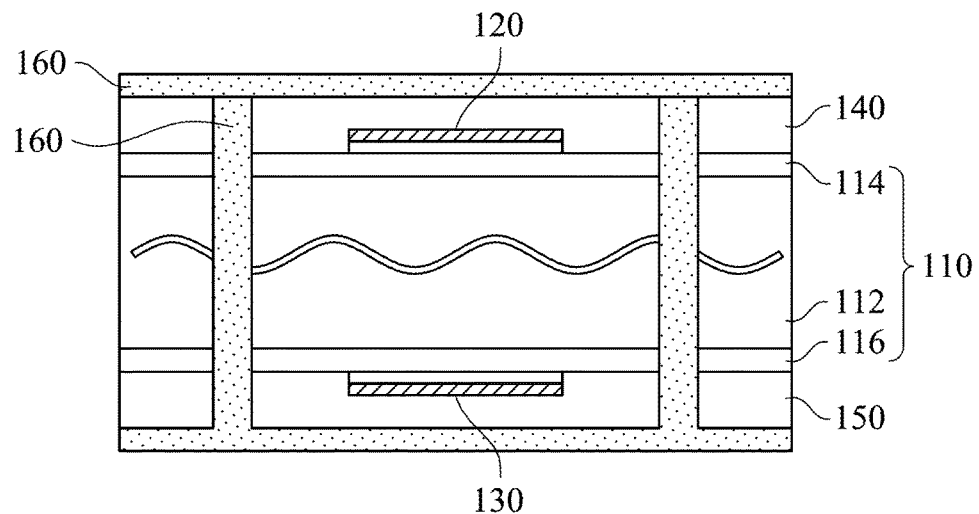
Figure 7C:
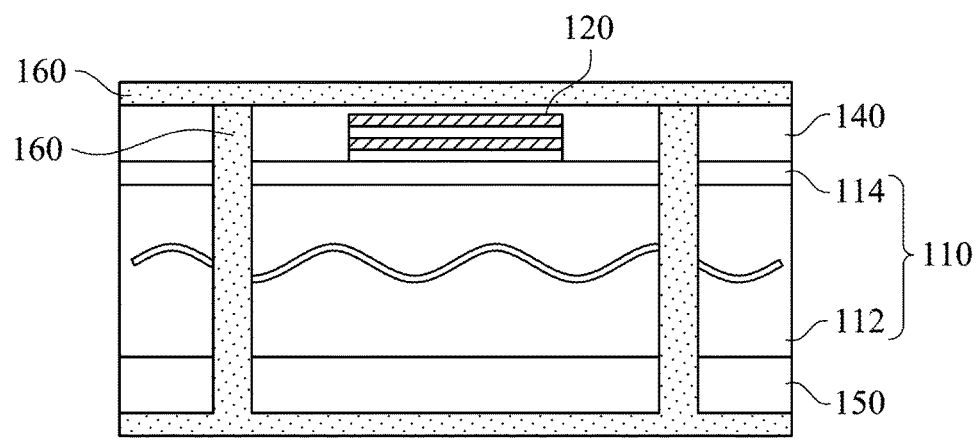

Next, method 10 proceeds to step S15 by forming a metal layer to cover the dielectric layer and the bottom of the substrate, and fill the holes, wherein portions of the metal layer which fill the holes form a plurality of conductive pillars. Please refer to FIGS. 7A-7C. FIGS. 7A-7C are cross-sectional views illustrating the formation of the metal layer 160 according to some embodiments of the present invention, wherein FIG. 7A illustrates an embodiment which follows the embodiment in FIG. 6A, and FIG. 7B illustrates an embodiment which follows the embodiment in FIG. 6B, and FIG. 7C illustrates an embodiment which follows the embodiment in FIG. 6C. In the embodiments in FIGS. 7A-7C, a metallization process is used to form the metal layer 160 which covers the dielectric layer 140 and the dielectric layer 150, and fills the holes 161, wherein portions of the metal layer 160 which fills the holes 161 form a plurality of conductive pillars 164. The methods of forming the metal layer 160 include but are not restricted to electroplating, plasma-enhanced atomic layer deposition, metalorganic chemical vapor deposition, chemical vapor deposition (CVD), physical vapor deposition (PVD), sputtering, or pulsed laser deposition. The composition of the metal layer 160 includes copper, silver, gold or other conductive materials.

Figure 8A:
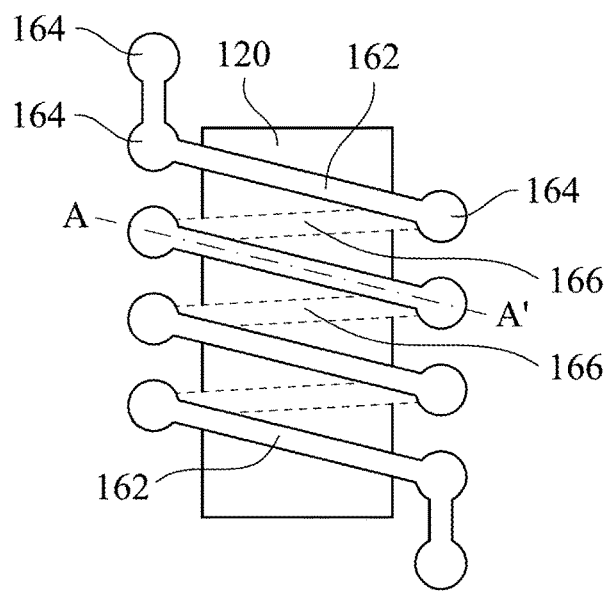
FIGS. 8A-8B are top views illustrating the formation of the first interconnect pattern, the conductive pillars and the second interconnect pattern according to some embodiments of the present invention.
Figure 8B:
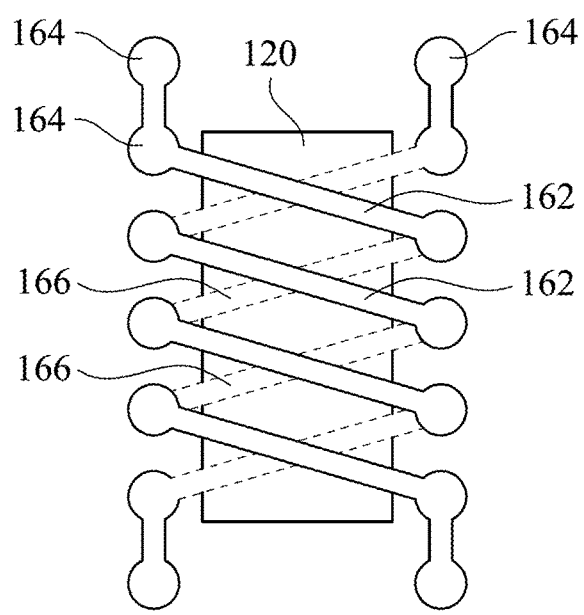

Next, method 10 proceeds to step S16 by patterning the metal layer to respectively form a first interconnect pattern on the dielectric layer and form a second interconnect pattern on the bottom surface of the substrate, wherein the first interconnect pattern, the second interconnect pattern and the conductive pillars form a helical structure surrounding the magnetic structure(s). Please refer to FIGS. 8A-8B, FIGS. 8A-8B are top views illustrating the formation of the first interconnect pattern 162, the conductive pillars 164 and the second interconnect pattern 166 according to some embodiments of the present invention. In the embodiment illustrated in FIG. 8A, after the metallization process, the metal layers which cover the dielectric layer 140 and the dielectric layer 150 are patterned to respectively form the first interconnect pattern 162 and the second interconnect pattern 166. In the embodiment illustrated in FIG. 8A, a plurality of conductive pillars 164 are disposed on two opposite sides of the first magnetic structure 120, and the first interconnect pattern 162 is disposed over the first magnetic structure 120, and the second interconnect pattern 166 (presented in dotted lines) is disposed below the first magnetic structure 120, wherein the conductive pillars 164 connect the first interconnect pattern 162 and the second interconnect pattern 166 to form an inductive coil with a single helical structure. The structure of the inductive coil in FIG. 8A is similar to that in FIG. 8B, both of the structures include a first interconnect pattern 162, a second interconnect pattern 166, a plurality of conductive pillars 164 and a first magnetic structure 120. The difference between FIG. 8A and FIG. 8B is that, the inductive coil in FIG. 8B is a double helical structure, which provides a higher density of the inductive coil. The number of turns of the inductive coil can be an integer, or can be a fraction according to the circuit layout requirements.

Figure 8C:
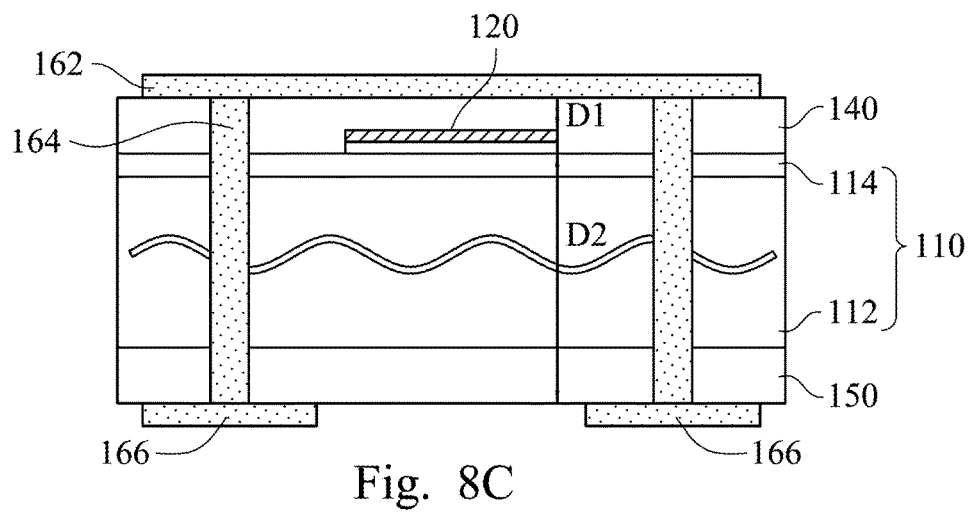
FIGS. 8C-8E are cross-section views along the cutting line A-A' in FIG. 8A according to some embodiments of the present invention.
Figure 8D:
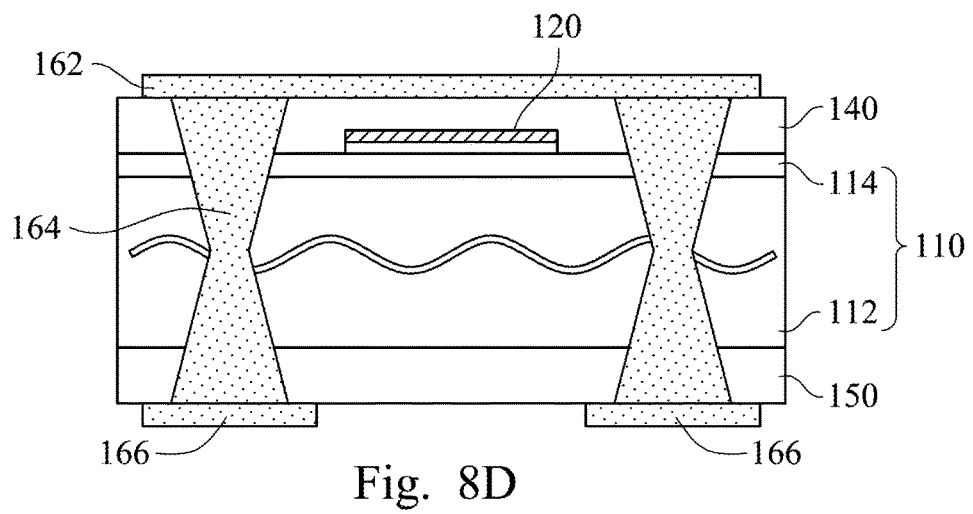
Figure 8E:
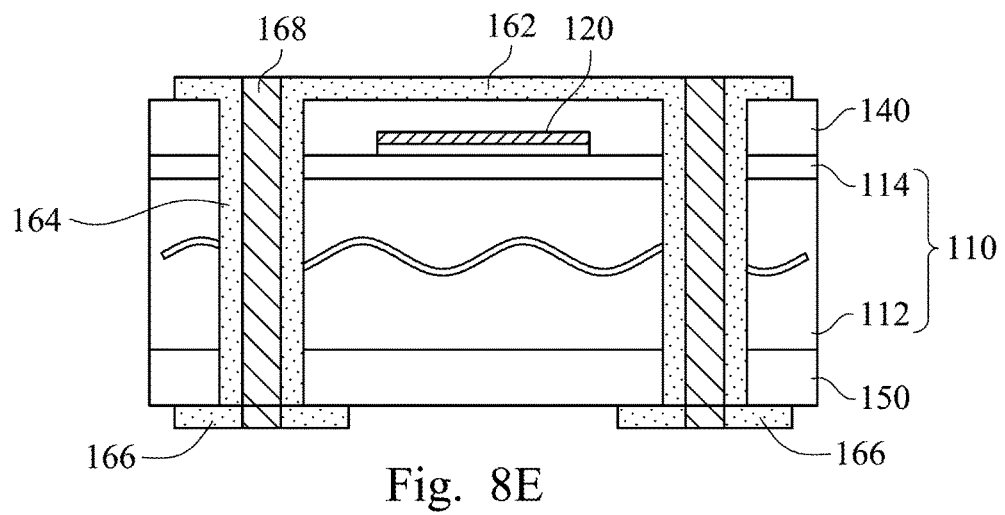

FIGS. 8C-8E are cross-section views along the cutting line A-A' in FIG. 8A according to some embodiments of the present invention. In the embodiment illustrated in FIG. 8C, the holes 161 are filled in the metallization process to form the conductive pillars 164. In one embodiment, a distance D1 is between the top surface of the first magnetic structure 120 and the surface where the first interconnect pattern 162 is disposed on, and a distance D2 is between the bottom surface of the first magnetic structure 120 and the surface where the second interconnect pattern 166 is disposed on. For the requirement of easing the process, the distance D1 and the distance D2 can be different. In another embodiment, the distance D1 can also equal to the distance D2 depending on the design requirements. In the embodiment illustrated in FIG. 8D, the holes 161 are filled in the metallization process to form the conductive pillars 164, and the middle portions of the conductive pillars 164 are thinner than the ends of the conductive pillars 164. In the embodiments illustrated in FIG. 8E, each of the conductive pillars 164 includes a columnar filler 168 and a metal surrounding the column 168. The columnar filler 168 can be, for example, a resin material, a composite material of polymer and glass-ceramic, or other suitable material.

Figure 9A:
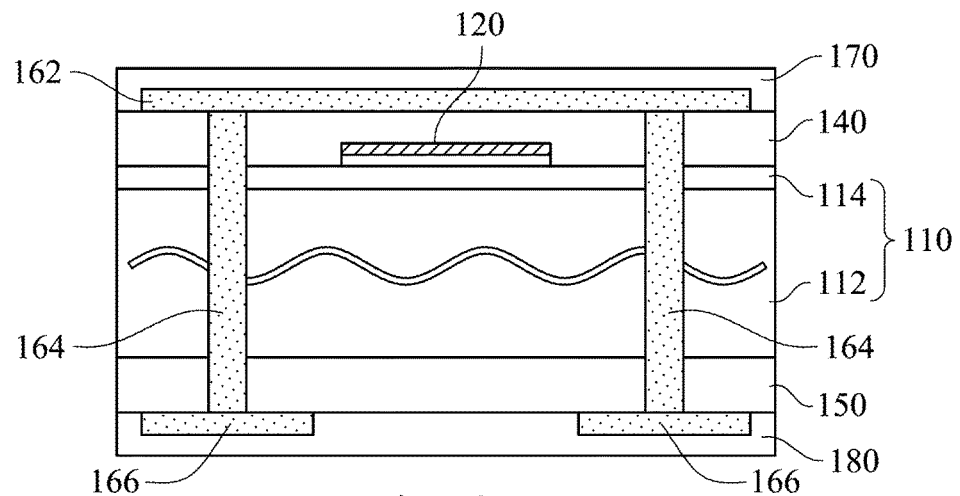
FIGS. 9A-9C are cross-sectional views illustrating the formation of the protective layers according to some embodiments of the present invention.
Figure 9B:
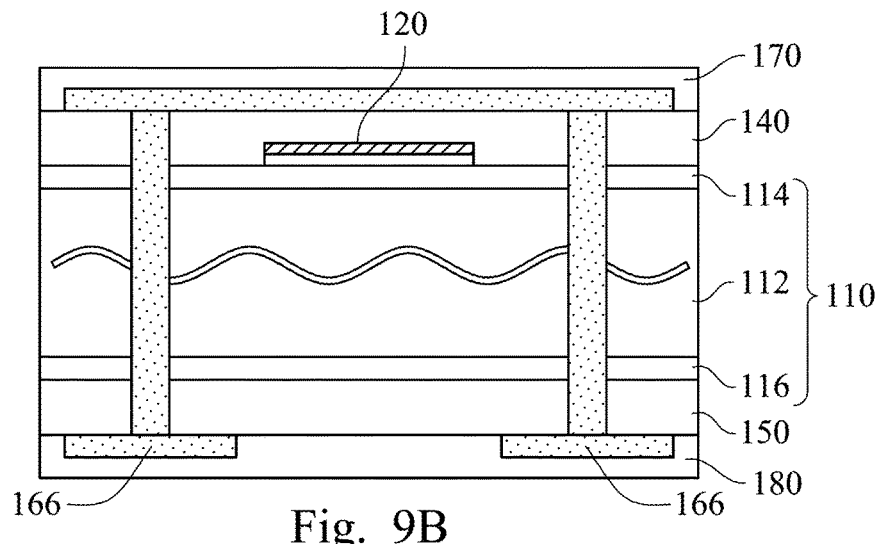
Figure 9C:
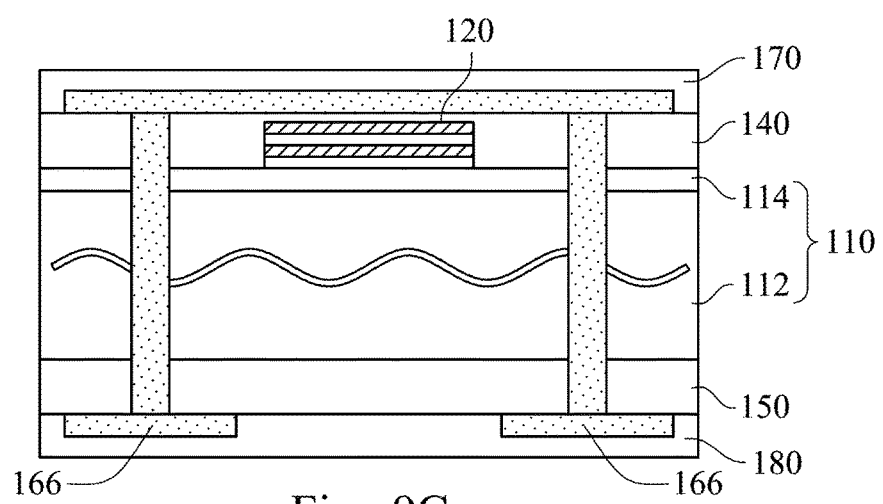

FIGS. 9A-9C are cross-sectional views illustrating the formation of the protective layers according to some embodiments of the present invention. After the first interconnect pattern 162 is formed, the second interconnect pattern 166 and the conductive pillars 164, the protective layer 170 and/or the protective layer 180 can be optional formed. The protective layer 170 covers the first interconnect pattern 162 and the dielectric layer 140. The protective layer 180 covers the second interconnect pattern 166 and the dielectric layer 150. The protective layer 170 and the protective layer 180 can be, for example, a polymer material and a glass fiber, a suitable polymer material, or a composite material of a polymer and a glass-ceramic.

Figure 10A:
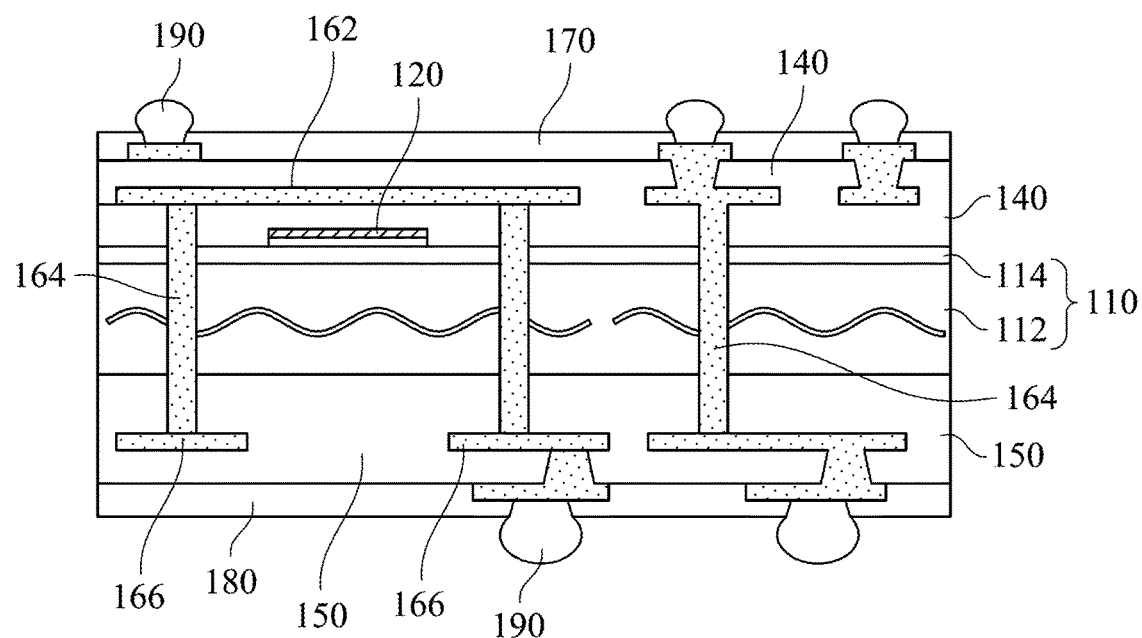
FIGS. 10A-10B are cross-sectional views of a circuit board according to some embodiments of the manufacturing method of the present invention.
Figure 10B:
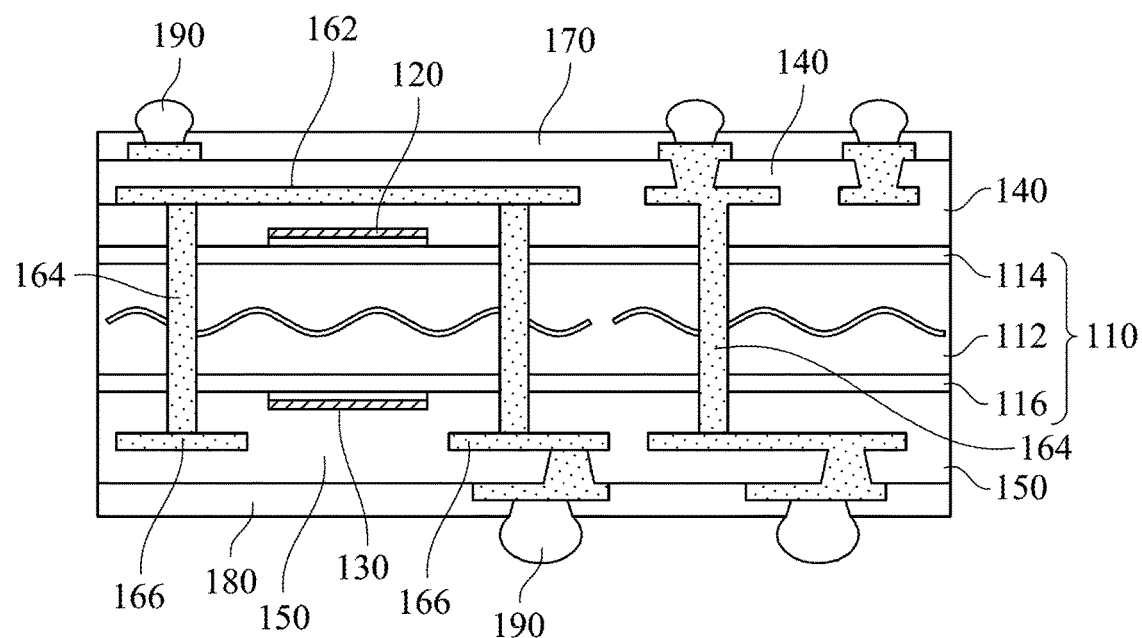

FIG. 10A-10B are cross-sectional views of a circuit board according to some embodiments of the present invention. In the embodiment illustrated in FIG. 10A, the circuit board includes a substrate 110, a first magnetic structure 120, a dielectric layer 140, a dielectric layer 150 and an inductive coil. The substrate 110 has a top surface and a bottom surface, the substrate 110 includes a base plate 112 and a dielectric layer 114. The first magnetic structure 120 is disposed on the top surface of the substrate 110. The dielectric layer 140 covers the substrate 110 and the first magnetic structure 120, and the dielectric layer 150 covers the bottom surface of the substrate 110. The inductive coil includes a first interconnect pattern 162, a second interconnect pattern 166 (illustrated in FIG. 8A) and a plurality of conductive pillars 164. The first interconnect pattern 162 is disposed in the dielectric layer 140. In one embodiment, the first interconnect pattern 162 can be disposed on the dielectric layer 140 depending on the design requirement. The second interconnect pattern is disposed in the dielectric layer 150. In one embodiment, the second interconnect pattern can be disposed on the dielectric layer 150. The conductive pillars connect the first interconnect pattern 162 and the second interconnect pattern 166, wherein the first interconnect pattern 162, the second interconnect pattern 166 and the conductive pillars 164 form a helical structure surrounding the first magnetic structure 120. The circuit board can include other components, such as, blind holes, buried holes, other circuits, bumps 190 or active/passive components. In one embodiment, at least one circuit layer is selectively disposed between the dielectric layer 140 and the protective layer 170, or/and at least one circuit layer is disposed on the dielectric layer 150 and in the protective layer 180. In this embodiment, the bumps 190 now are disposed on the newly added circuit layer.

In the embodiment illustrated in FIG. 10B, the structure in FIG. 10B is similar to that of FIG. 10A, and the difference between FIG. 10B and FIG. 10A is that the circuit board in FIG. 10B additionally has the dielectric layer 116 and the second magnetic structure 130, and the dielectric layer 116 covers the bottom surface of the base plate 112, and the second magnetic structure 130 is disposed on the dielectric layer 116. The dielectric layer 150 covers the second magnetic structure 130 and the dielectric layer 116. The first magnetic structure 120 and the second magnetic structure 130 are disposed in the inductive coil.

In summary, exemplary embodiments of the present invention provide a circuit board and a method of manufacturing the same, wherein the circuit board has at least a magnetic structure and an inductive coil surrounding the magnetic structure, to reduce the size of the package while maintaining the efficiency of the inductive components.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit board, comprising:
    a substrate having a top surface and a bottom surface;
    a first magnetic structure disposed on the top surface of the substrate;
    a first dielectric layer covering the substrate and the first magnetic structure; and
    an inductive coil comprising:
        a first interconnect disposed on the first dielectric layer;
        a second interconnect disposed on the bottom surface of the substrate; and
        a plurality of conductive pillars connecting the first interconnect and the second interconnect, wherein the first interconnect, the second interconnect and the conductive pillars form a helical structure surrounding the first magnetic structure.

2. The circuit board of claim 1, wherein the substrate comprises a polymer base plate, a second dielectric layer and a third dielectric layer, and the second dielectric layer and the third dielectric layer are respectively disposed on two opposite surfaces of the polymer base plate, wherein the first magnetic structure contacts the second dielectric layer.

3. The circuit board of claim 2, further comprising a fourth dielectric layer and a second magnetic structure disposed between the polymer base plate and the third dielectric layer, wherein the second magnetic structure is disposed between the fourth dielectric layer and the third dielectric layer.

4. The circuit board of claim 1, wherein the first magnetic structure comprises at least one magnetic composite layer, the magnetic composite layer comprises:
    a dielectric film; and
    a magnetic material disposed on the dielectric film.

5. The circuit board of claim 1, wherein the conductive pillars penetrate the substrate and the first dielectric layer.

6. The circuit board of claim 4, wherein the magnetic material is iron, cobalt, nickel, rubidium, or an alloy thereof.

7. The circuit board of claim 1, further comprising a first protective layer covering the first interconnect and the first dielectric layer, and a second protective layer covering the second interconnect and the bottom surface of the substrate.

8. A method of manufacturing a circuit board, comprising:
    providing a substrate, the substrate having a top surface and a bottom surface;
    forming a magnetic structure on the top surface;
    forming a dielectric layer covering the magnetic structure;
    forming a plurality of holes, the holes penetrating the substrate and the dielectric layer;
    forming a metal layer covering the dielectric layer and the bottom surface, and filling the holes, wherein portions of the metal layer which fill the holes form a plurality of conductive pillars; and
    patterning the metal layer to respectively form a first interconnect pattern on the dielectric layer and a second interconnect pattern on the bottom surface, wherein the first interconnect pattern, the second interconnect pattern, and the conductive pillars form a helical structure surrounding the magnetic structure.

9. The method of claim 8, wherein the metal layer is formed by electroplating, plasma-enhanced atomic layer deposition (ALD), metalorganic chemical vapor deposition, chemical vapor deposition (CVD), physical vapor deposition (PVD), sputtering, or pulsed laser deposition (PLD).

10. The method of claim 8, wherein forming the magnetic structure comprises alternately forming a plurality of dielectric films and a plurality of magnetic layers, wherein each of the dielectric films and each of the magnetic layers are alternately stacked.

* * * * *